United States Patent

Arakawa et al.

[11] Patent Number: 5,870,820
[45] Date of Patent: Feb. 16, 1999

[54] IC MOUNTING/DEMOUNTING SYSTEM AND MOUNTING/DEMOUNTING HEAD THEREFOR

[75] Inventors: Isao Arakawa; Yoshinori Hirata, both of Kumamoto, Japan

[73] Assignee: Mitsubishi Denki Kabushiki Kaisha, Tokyo, Japan

[21] Appl. No.: 903,305

[22] Filed: Jul. 30, 1997

[30] Foreign Application Priority Data

Feb. 7, 1997 [JP] Japan .................................. 9-025402

[51] Int. Cl.[6] .................................................. B23P 19/02
[52] U.S. Cl. ............................ 29/740; 29/743; 414/225; 901/6; 901/40
[58] Field of Search ........................... 29/739, 740, 743, 29/760, 762, DIG. 44; 414/225; 901/40, 6

[56] References Cited

U.S. PATENT DOCUMENTS

| | | | |
|---|---|---|---|
| 4,547,031 | 10/1985 | Korsunsky | 339/75 M |
| 4,770,599 | 9/1988 | Hawkswell | 29/740 |
| 4,801,561 | 1/1989 | Sankhagowit | 29/741 X |
| 4,908,092 | 3/1990 | Koibuchi | 29/740 |
| 5,074,036 | 12/1991 | Dunaway et al. | 29/834 |
| 5,084,962 | 2/1992 | Takahashi et al. | 29/833 |
| 5,093,984 | 3/1992 | Lape | 29/743 X |
| 5,230,143 | 7/1993 | Karlovich | 29/764 |

Primary Examiner—S. Thomas Hughes
Assistant Examiner—Rick Kiltae Chang
Attorney, Agent, or Firm—Leydig, Voit & Mayer

[57] ABSTRACT

An IC mounting/demounting system wherein a plurality of holding sections are fixedly secured to an index plate rotatable by a servo motor. A plurality of IC's are successively mounted and demounted on a socket board or a tray, and the plurality of IC's are simultaneously held and transferred. This improves the efficiency of the IC transferring work between the socket board and the tray and shortens working time.

10 Claims, 21 Drawing Sheets

FIG. 14
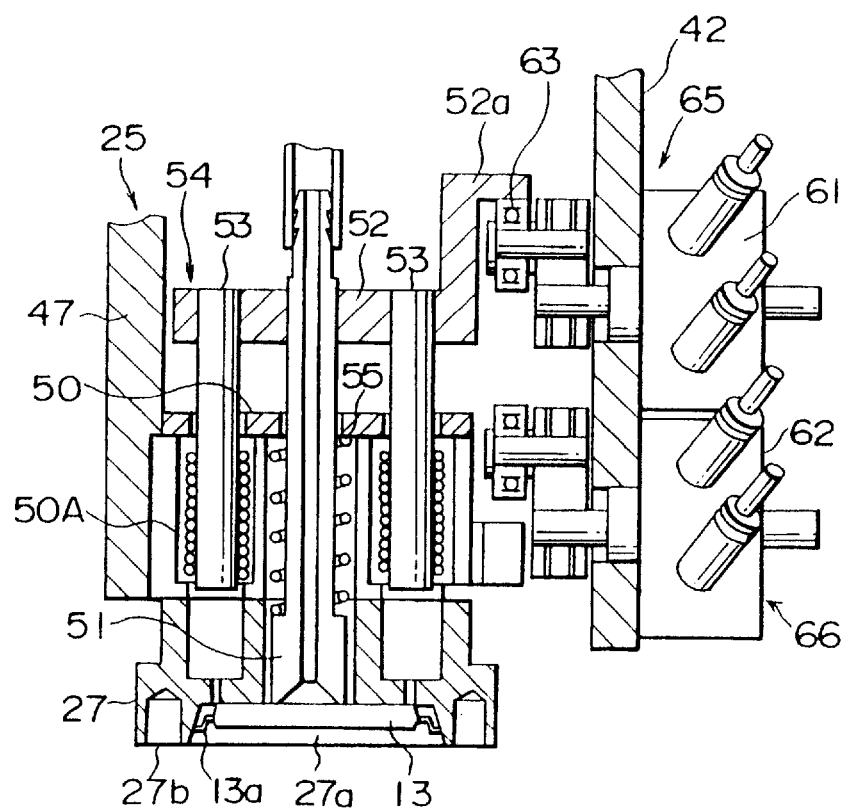
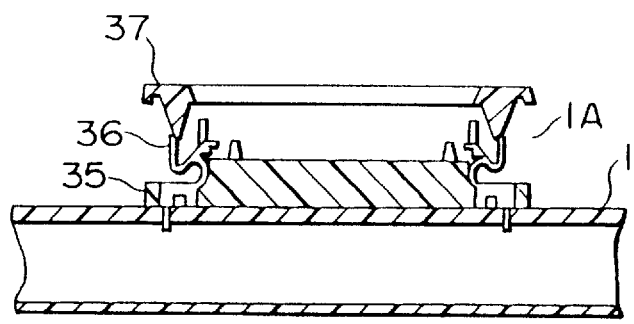

FIG. 19
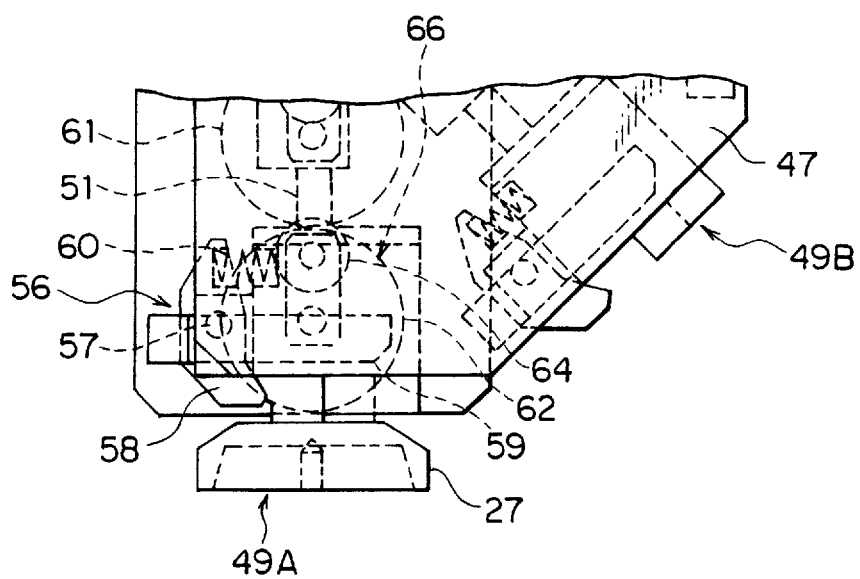
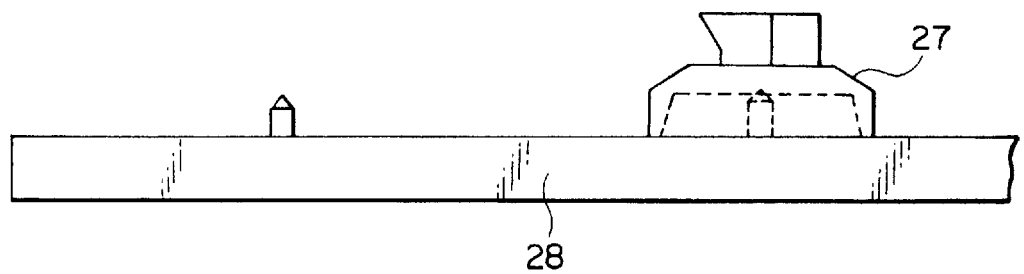

IC MOUNTING/DEMOUNTING SYSTEM AND MOUNTING/DEMOUNTING HEAD THEREFOR

BACKGROUND OF THE INVENTION

1. Field of the Invention

The present invention relates to an IC mounting/demounting system and an IC mounting/demounting head therefor for transferring an IC on a tray and mounting the IC on an IC socket on a socket board for a burn-in process or demounting the IC from the IC socket and transferring the IC on the tray.

2. Description of the Related Art

Conventionally, a fabricated IC (IC package) passes through a burn-in process turned on for a predetermined time at a high temperature of, for example, 120° to 130° C. and thereafter, undergoes an electrical operation test. In the burn-in process, an IC is mounted on each of a plurality of IC sockets arranged on a socket board, that is, the IC is electrically connected with the IC socket, and the socket board is set in a burn-in oven. Therefore, a process for transferring an IC to an IC socket on a socket board and mounting/demounting the IC on or from the IC socket is necessary before and after the burn-in process and an IC mounting/demounting system is used for the process.

FIG. 24 is a perspective view showing an example of a conventional IC mounting/demounting system. In the figure, a socket board (burn-in board) 1 on which a plurality of IC sockets (not illustrated) are mounted is transferred one by one from a board magazine 3 by a board transfer section 2. A tray housing section 5 in which a plurality of trays 4 are housed is set nearby the board transfer section 2. A plurality of IC's (not illustrated) are mounted on each tray 4.

The IC's are transferred between the socket board 1 and the tray 4 by a robot body 6. Two mounting/demounting heads 7 for sucking and holding the IC's are mounted on the robot body 6. The interval between these two mounting/demounting heads 7 can be adjusted in accordance with the pitch between the IC sockets on the socket board 1 and the pitch between the IC's housed in the tray 4. Moreover, a tray chuck 8 for transferring the tray 4 is mounted on the robot body 6.

Next, the operation will now be described. For example, to mount the IC's on the tray 4 housed in the tray housing section 5 on the IC sockets on the socket board 1, the mounting/demounting heads 7 are moved onto the IC on the tray 4 by the robot body 6 to suck and hold two IC's. Thereafter, the mounting/demounting heads 7 are moved over the IC sockets on the socket board 1 to mount the IC on the IC sockets and cancel the suction.

In this case, because the IC socket is provided with a cover for opening/closing the contacts, the IC is set to the IC socket by pressing the cover with the mounting/demounting head and thereby opening the contacts. Then, by moving the mounting/demounting head 7 upward, the pressure on the cover is released, the contacts are closed, and the IC is held by the IC socket. Moreover, the IC is positioned in the mounting/demounting head 7 by correcting the shoulder portions of the IC by chucks (not illustrated) from four directions.

Thus, the IC's are mounted by two on the IC sockets on the socket board 1 from the tray 4. When an IC is mounted on every IC socket on the socket board 1, the next socket board 1 is supplied by the board transfer section 2. When all the IC's are removed from the tray 4, a new tray 4 is supplied by the tray chucking section 8.

As described above, a burn-in process is carried out after the socket board with the IC's mounted on the IC sockets is placed in a burn-in oven (not illustrated). After the burn-in process, the IC's on the IC sockets are transferred to the tray 4 by reversing the above procedure.

In the conventional IC mounting/demounting system constructed as described above, since the mounting/demounting head is moved between the socket board 1 and the tray 4, operating efficiency is impaired and transferring the IC's requires much time. Further, it is necessary to position the IC by the chucks and press the cover of the IC socket by socket pushers (not illustrated) of the mounting/demounting head when the IC is mounted and demounted on the IC socket. However, because various sizes of IC sockets are used corresponding to the IC to be mounted, it is necessary to store various mounting/demounting heads having a socket pusher corresponding to each IC socket size and the chucks corresponding to the IC size and to replace the whole of the mounting/demounting head whenever the type of IC and IC socket are changed. To perform the above mounting/demounting head replacement, operations of the system must be stopped for 15 to 20 minutes or more thereby lowering operation efficiency. Particularly, as the number of diversified low-volume products increases, the frequency of mounting/demounting head replacement increases and the time and labor required for the replacement greatly influence operation efficiency.

There is a system for simultaneously transferring a lot of IC's by a robot having a plurality of mounting/demounting heads corresponding to only IC's and IC sockets of specific sizes. However, the system is also unsuitable for the above diversified low-volume product manufacture because the whole system must be stopped while the different size IC's and IC sockets are handled.

SUMMARY OF THE INVENTION

The present invention has been achieved with a view toward solving the problems described above, and it is an object of the present invention to provide an IC mounting/demounting system and an IC mounting/demounting head therefor which is capable of greatly improving the operation efficiency and reducing time for transferring IC's between a socket board and a tray.

To this end, according to one aspect of the present invention, there is provided an IC mounting/demounting system comprising: a tray supply section for supplying a tray bearing a plurality of IC's; a socket board supply section for supplying a socket board having a plurality of IC sockets to and from which the IC's are mounted and demounted by pressing and displacing a movable portion; a robot body for transferring the IC's between the tray supplied to the tray supply section and the socket board supplied to the socket board supply section; a mounting/demounting head including a head body supported by the robot body and a socket pusher placed on the head body to be rotatable and movable and made to press the movable portion, and the mounting/demounting head further having a plurality of holding sections each for sucking and holding the IC; and a control section for controlling operations of the robot body and the mounting/demounting head.

According to another aspect of the present invention, there is provided a mounting/demounting head of an IC mounting/demounting system comprising: a head body supported by a robot body; and a plurality of holding sections placed on the head body to be rotatable and movable, each of the holding sections having a socket pusher for pressing a movable portion of an IC socket at mounting and demounting of an IC to and from the IC socket and the holding section sucking and holding of the IC.

BRIEF DESCRIPTION OF THE DRAWINGS

FIG. 14 is a cross-sectional view showing an IC connection operation by the FIG. 8 mounting/demounting head;

FIG. 19 is a cross-sectional view showing a state where the mounting/demounting head having the centering tool of FIG. 18 is lifted;

DETAILED DESCRIPTION OF THE PREFERRED EMBODIMENTS

Embodiments of the present invention will be described hereinbelow with reference to the drawings.

First Embodiment

Figure 1:
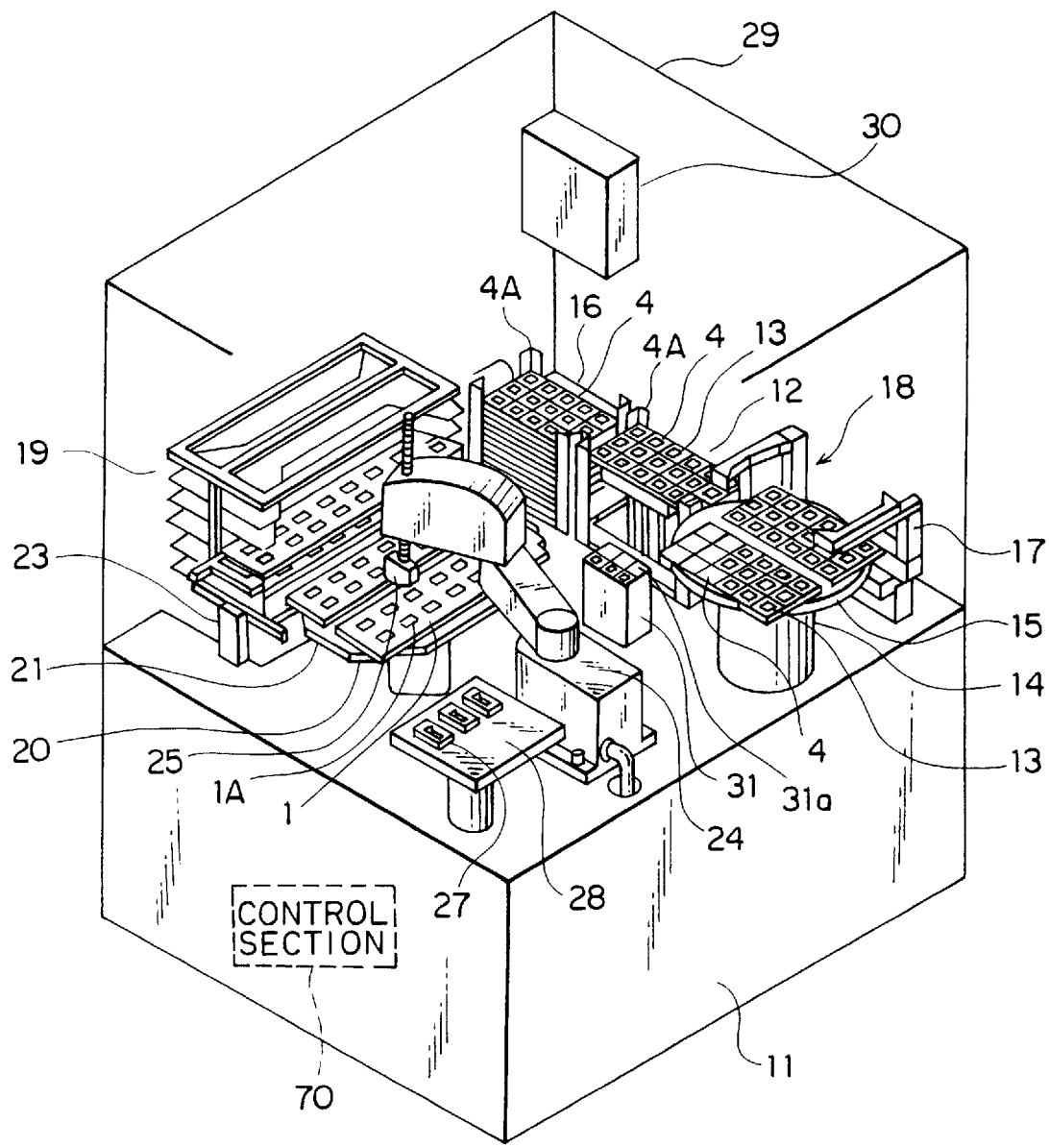
FIG. 1 is a perspective view showing an IC mounting/demounting system according to a first embodiment of the present invention.
Figure 2:
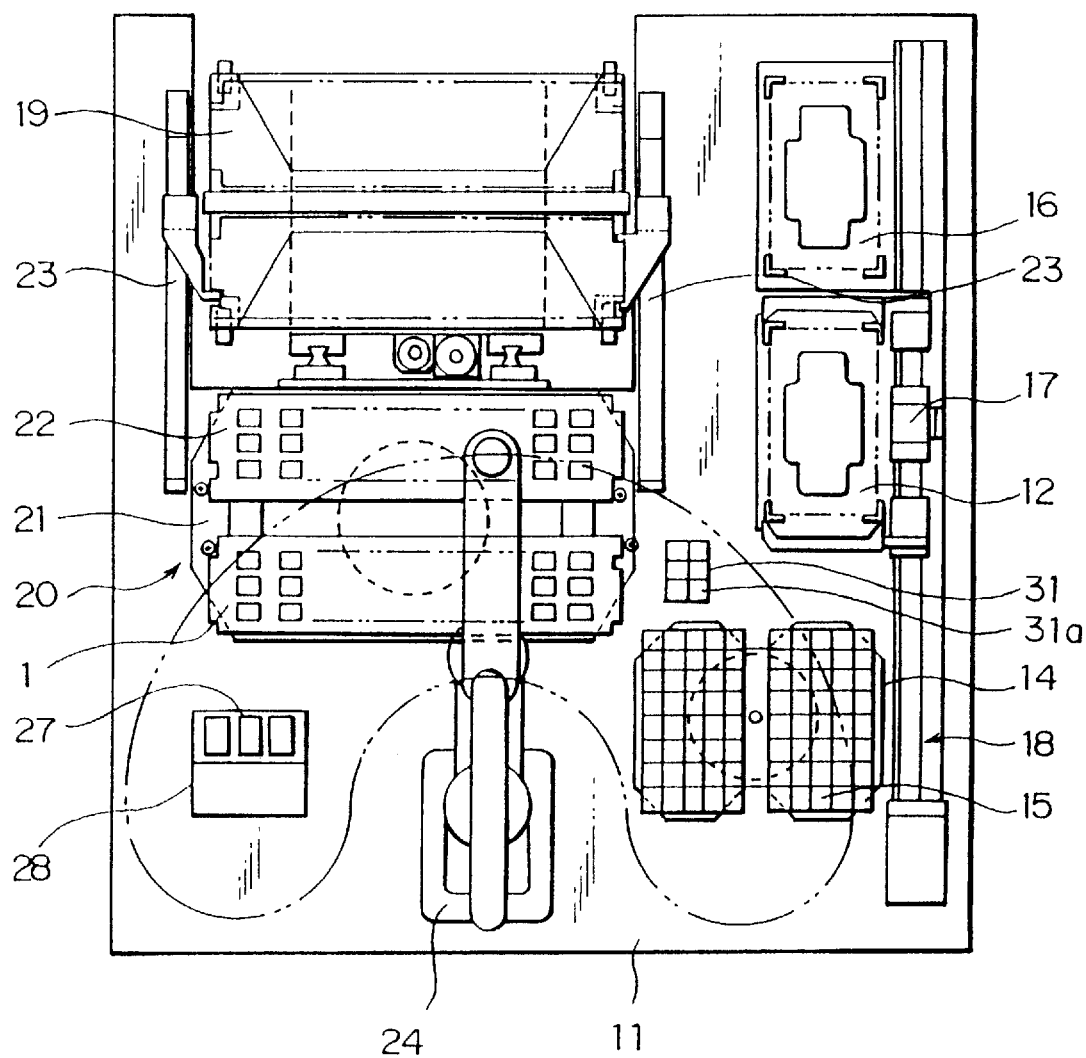
FIG. 2 is a plan view showing the FIG. 1 system.

FIG. 1 is an perspective view showing a IC mounting/demounting system according to an embodiment of this invention, and FIG. 2 is a plan view showing the FIG. 1 system. On an installation base 11 there are placed two tray lifting devices 12, 16 for gradually lifting and supplying a plurality of trays 4 piled up. Each of the trays 4 is structurally made to position and bear a plurality of IC's (IC packages) 13.

A tray table 14 to which the trays 4 are transferred from the tray lifting device 12 or 16 is provided to be adjacent to one side of the tray lifting device 12. This tray table 14 is equipped with a tray bearer 15 rotatable and made to support two trays 4, and the two trays 4 on the tray bearer 15 are interchangeable in position in a manner that the tray bearer 15 is rotated by 180 degrees. A tray conveying device 17 takes charge of the transportation of the trays 4 between the tray lifting devices 12, 16 and the tray table 14. Further, the tray lifting devices 12, 16, the tray table 14 and the tray conveying device 17 constitute a tray supply section 18.

A socket board rack 19, accommodating a plurality of socket boards (burn-in socket boards) 1 so that they are liftable, is joined at a given position on the installation base 11. In addition, provided on the installation base 11 is a socket board table 20 serving as a socket board supply section. This socket board table 20 is provided with a socket board bearer 21 rotatable and made to bear two socket boards 1, and the two socket boards on the socket board bearer 21 are interchangeable in position by the rotation of the socket board bearer 21 by 180 degrees. A socket board conveying device 23 carries out the transportation of the socket boards 1 between the socket board rack 19 and the socket board table 20.

Furthermore, provided on the installation 11 is a robot body 24 which transfers the IC's 13 between the tray 4 on the tray table 14 and the socket board on the socket board table 20. This robot body 24 supports a mounting/demounting head 25 which can simultaneously transfer a plurality of IC's 13 (in this case, three) so that it is movable vertically. Moreover, within the operating range of the mounting/demounting head 25 due as limited by the robot body 24 there is provided a centering unit stocker 28 for supporting a plurality of sets of centering tools 27 to be mounted on the mounting/demounting head 25. Placed on this centering unit stocker 28 are a plurality of sets of centering tools 27 corresponding to different size IC's 13.

A control panel 30 is fixedly secured to a transparent cover 29 situated on the installation base 11. The installation base 11 accommodates a control section 70 having a sequence controller for controlling operations of the robot body 24 and the mounting/demounting head 25 and further for controlling the operation of the entire system, and the control panel 30 is connected with this control section 70.

Within the operating range of the robot body 24 on the installation base 11, there is provided a temporary resting stage 31 having a plurality of IC supporting sections 31a for receiving the IC during transportation between the tray 4 and the socket board 1. The IC supporting sections 31a of the temporary resting stage 31 are made to agree with the IC's 13 having a plurality of sizes (in this case, two).

Next, a description of a basic operation of the entire system will follow. First of all, a tray magazine 4A accommodating a plurality of trays 4 piled up and carrying the IC's 13 before the burn-in test is put on the tray lifting device 12, and the socket board rack 19 accommodating a plurality of socket boards 1 after the burn-in test are joined at a given position.

Thereafter, the system operation is started by operating the control panel 30. With the tray lifting device 12, the trays 4 within the tray magazine 4A are gradually lifted so that the uppermost tray 4 is conveyed by the tray conveying device 17 to the tray bearer 15 of the tray table 14. After this, the tray table 14 rotates half way so that the tray table 14 can accept the next tray 4. In a similar way, two socket boards 1 are transferred onto the socket board table 20.

In this state, the mounting/demounting head 25 is shifted by the robot body 24 to be above the socket board 1 on the socket board table 20, and three tested IC's 13 are extracted by the mounting/demounting head 25. These IC's 13 are sucked up by the mounting/demounting head 25 in positioned conditions and conveyed onto the temporary resting stage 31, and further are released one by one from the mounting/demounting head 25 and placed on the IC supporting section 31a in an arranged state.

Subsequently, the mounting/demounting head 25 is shifted to above the tray 4 on the tray table 14 to absorb three untested IC's 13. These IC's 13 are connected one by one to the vacant IC sockets to which the IC's 13 on the socket board 1 have been connected. Then, the next three IC's 13 on the same socket board 1 are picked up by the mounting/demounting head 25 and transferred to the tray 4.

By repeating this operation, the untested IC's 13 are coupled to all the sockets 1A on the one socket board 1, and then the socket board table 20 is rotated half way and the tested IC's 13 on the next socket board 1 are replaced with the untested IC's 13. Further, the socket board 1 where the untested IC's 13 are connected to all the IC sockets 1A is returned by the socket board conveying device 23 to within the socket board rack 19 during the operation for the next socket board 1, and in place another socket board 1 within the socket board rack 19 is transferred and put on the socket board table 20.

On the other hand, when all the IC's 13 on the tray 4 are interchanged with the tested IC's 13, the tray table 14 is rotated half way and the untested IC's 13 on the next tray 4 are replaced with the tested IC's 13. Further, during the work for the next tray 4 the tray 4 filled with the tested IC's 13 is transferred to a vacant tray magazine 4A of the tray lifting device 16 by the tray conveying device 17. And the following tray 4 is conveyed onto the tray table 14. After the repetition of this operation, at the time load time the IC's 13 on the temporary resting stage 31 are transferred to the tray 4.

Furthermore, when the size of the IC 13 to be handled changes, the information on the kind of IC 13 is input the control panel 30, whereupon, the mounting/demounting head 25 is moved above the centering tool stocker 28 and the centering tool 27 is automatically replaced to match the size of the IC's 13. In this example, three centering tools 27 are mounted on one mounting/demounting head 25, and hence these three centering tools 27 are all replaced with centering tools 27 having different sizes.

Since, as described before, the mounting/demounting head 25 carries three IC's 13 at a time, it is possible to decrease the number of times of the mounting/demounting head 25 reciprocates between the socket board 1 and the tray 4, which can improve the working efficiency and reduce the working time.

Furthermore, since the replacement of the socket board 1 by the socket board table 20 and the replacement of the tray 4 by the tray table 14 are instantaneously possible, these replacement operations do not require the system to stop, thus improving working efficiency. In addition, changes in the kind of IC 13 are possible in only a short time because only the centering unit 27 is replaced without having to replace the whole mounting/demounting head 25, thus enhancing the working efficiency accompanying changes in IC type.

Incidentally, the carrying procedure of the IC's 13 is not limited to the above. For example, it is also possible that the untested IC's 13 on the tray 4 are first transferred onto the temporary resting stage 31.

Furthermore, if the vacant tray 4 or the vacant socket board 1 is initially conveyed onto the tray table 14 or the socket board table 20, the replacement between the untested IC and the tested IC is possible without the use of the temporary resting stage 31. Moreover, if the three sections of the first tray 4 or the three IC sockets 1A of the first socket board 1 are emptied, the replacement between the untested IC and the tested IC is also possible without the use of the temporary resting stage 31.

Figure 3:
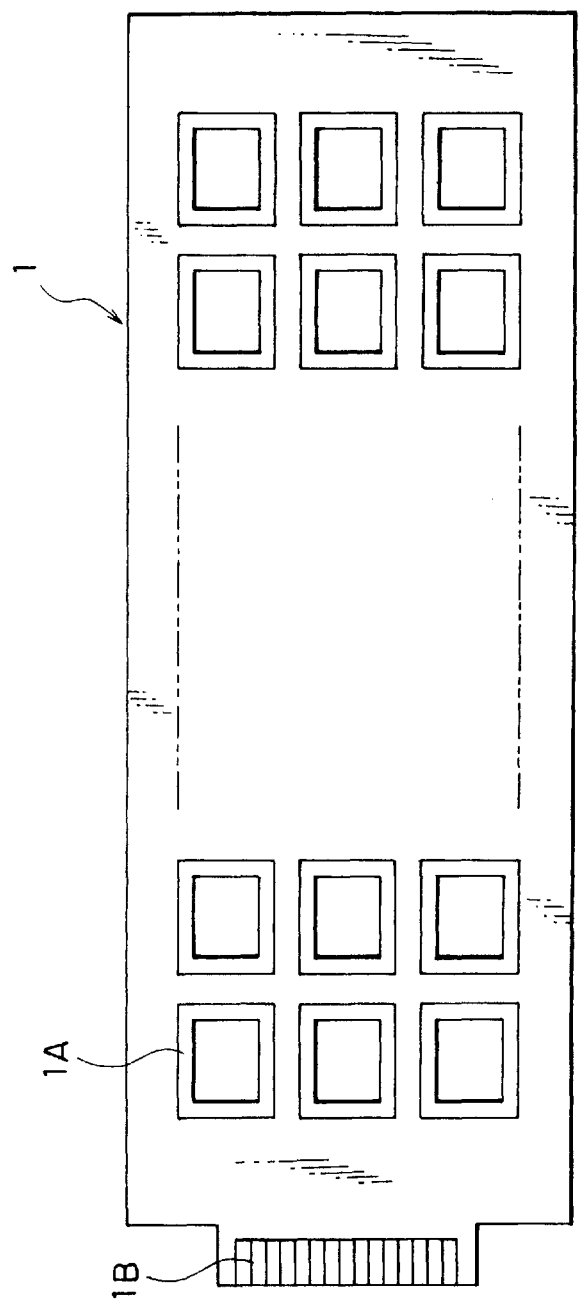
FIG. 3 is a plan view showing one example of socket boards.

Next, a detailed description will follow the respective sections of the IC mounting/demounting system shown in FIG. 1. FIG. 3 is a plan view showing one example of a socket board 1. In the illustration, a plurality of IC sockets 1A are arranged on the socket board 1 and further a wiring pattern (not shown) is placed thereon for energizing these IC sockets 1A. In addition, at one end portion of the socket board 1 there is provided a connector 1B which is inserted into a connecting section of a burn-in furnace (not shown) to be electrically coupled thereto.

Figure 4:
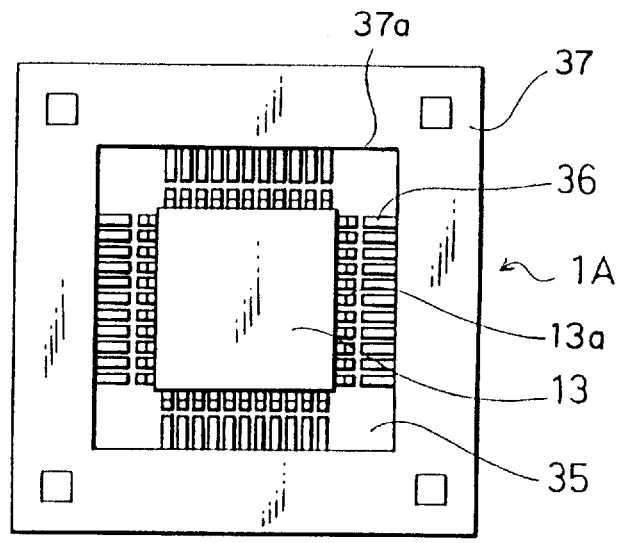
FIG. 4 is a plan view showing one example of IC sockets.
Figure 5:
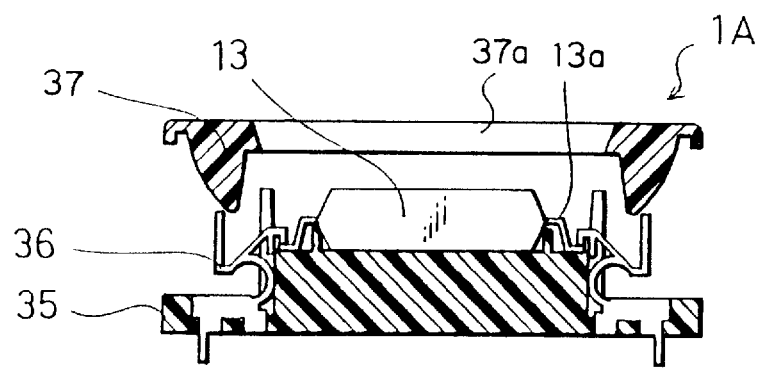
FIG. 5 is a cross-sectional view showing the FIG. 4 IC socket.
Figure 6:
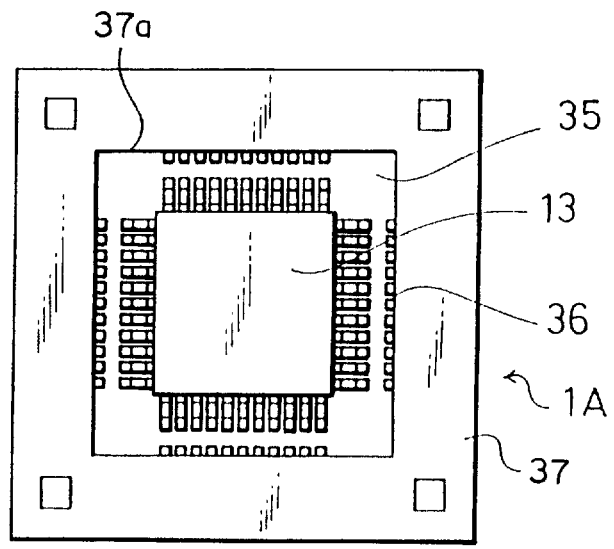
FIG. 6 is a plan view showing a state where a cover shown in FIG. 4 undergoes depression.
Figure 7:
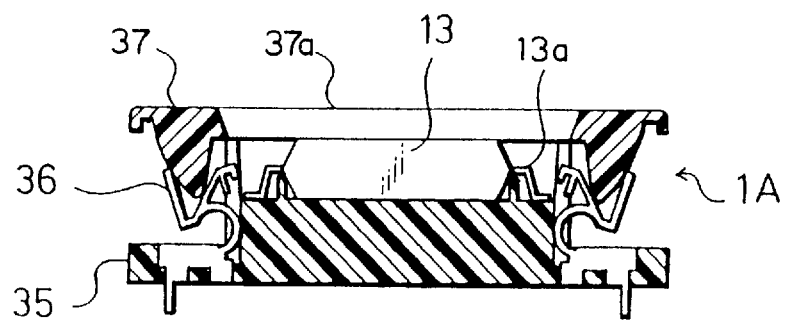
FIG. 7 is a cross-sectional view of the state shown in FIG. 6 state.

FIG. 4 is a plan view showing one example of IC sockets, FIG. 5 is a cross-sectional view of the FIG. 4 IC socket, FIG. 6 is a plan view showing a state where a cover shown in FIG. 4 is in a pressed condition, and FIG. 7 is a cross-sectional view of FIG. 6. On a base 35 of the IC socket 1A, a plurality of contact pins 36 elastically deformable are provided in corresponding relation to external leads 13a of the IC 13. These contact pins 36 hold down the external leads 13a from the above by their elastic forces. In addition, provided on the base 35 is a cover 37 serving as a movable section engaged with all the contact pins 36, and an opening 37a is provided in a central portion of the cover 37 to allow the insertion of the IC 13.

In such an IC socket 1A, the cover 37 is evenly pressed by the mounting/demounting head 25 (see FIG. 1) when mounting/demounting the IC 13 so that all the contact pins 36 are elastically deformed to release the external leads 13a as shown in FIG. 7. On releasing the cover 37 from this pressing, the cover 37 moves upwardly, so that the contact pins 36 return to their original shapes and the external leads 13a are pressed by the contact pins 36. Accordingly, the external leads 13a and the contact pins 36 come into electric connection with each other.

Figure 8:
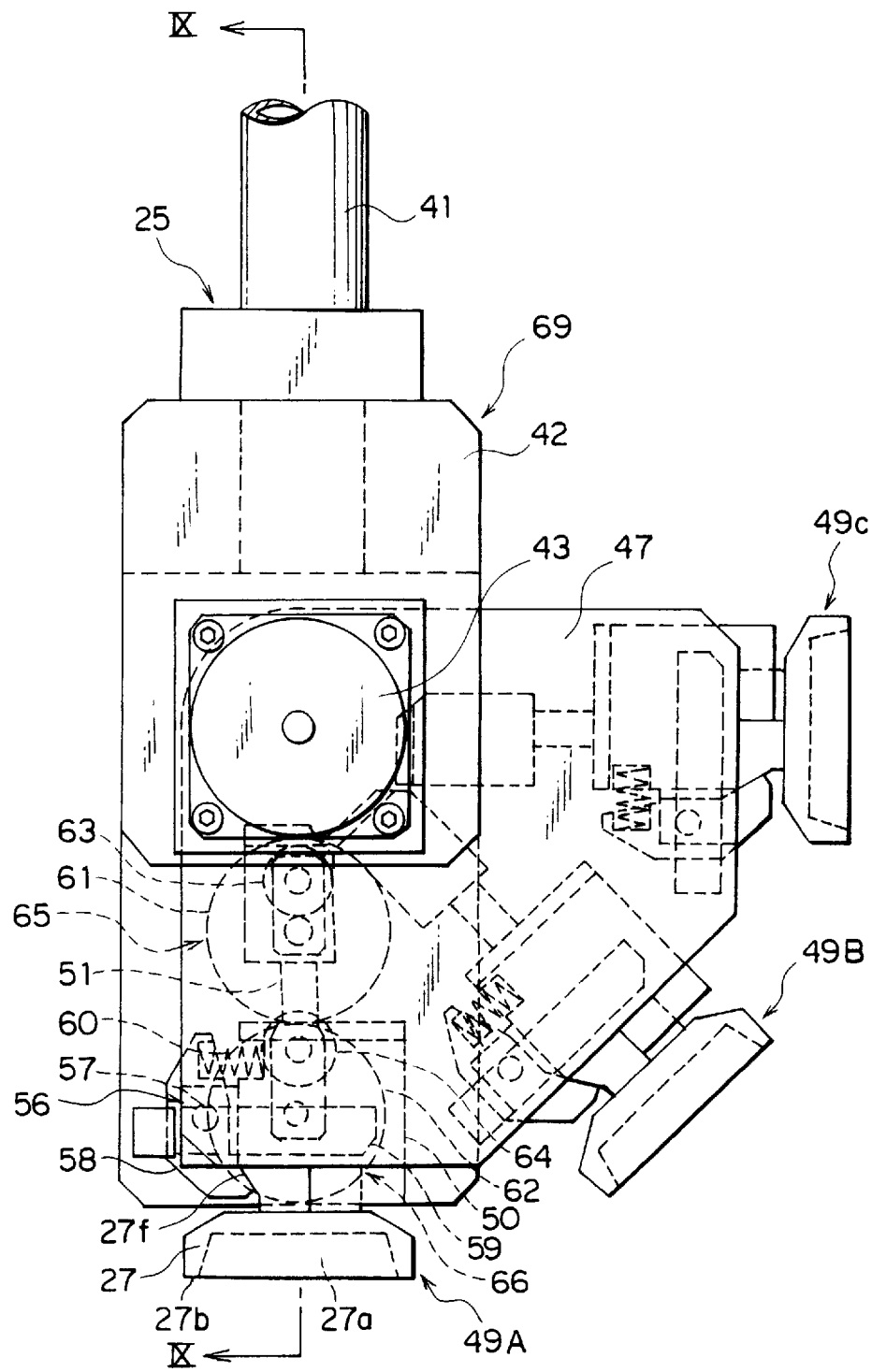
FIG. 8 is a front elevational view showing the FIG. 1 mounting/demounting head.
Figure 9:
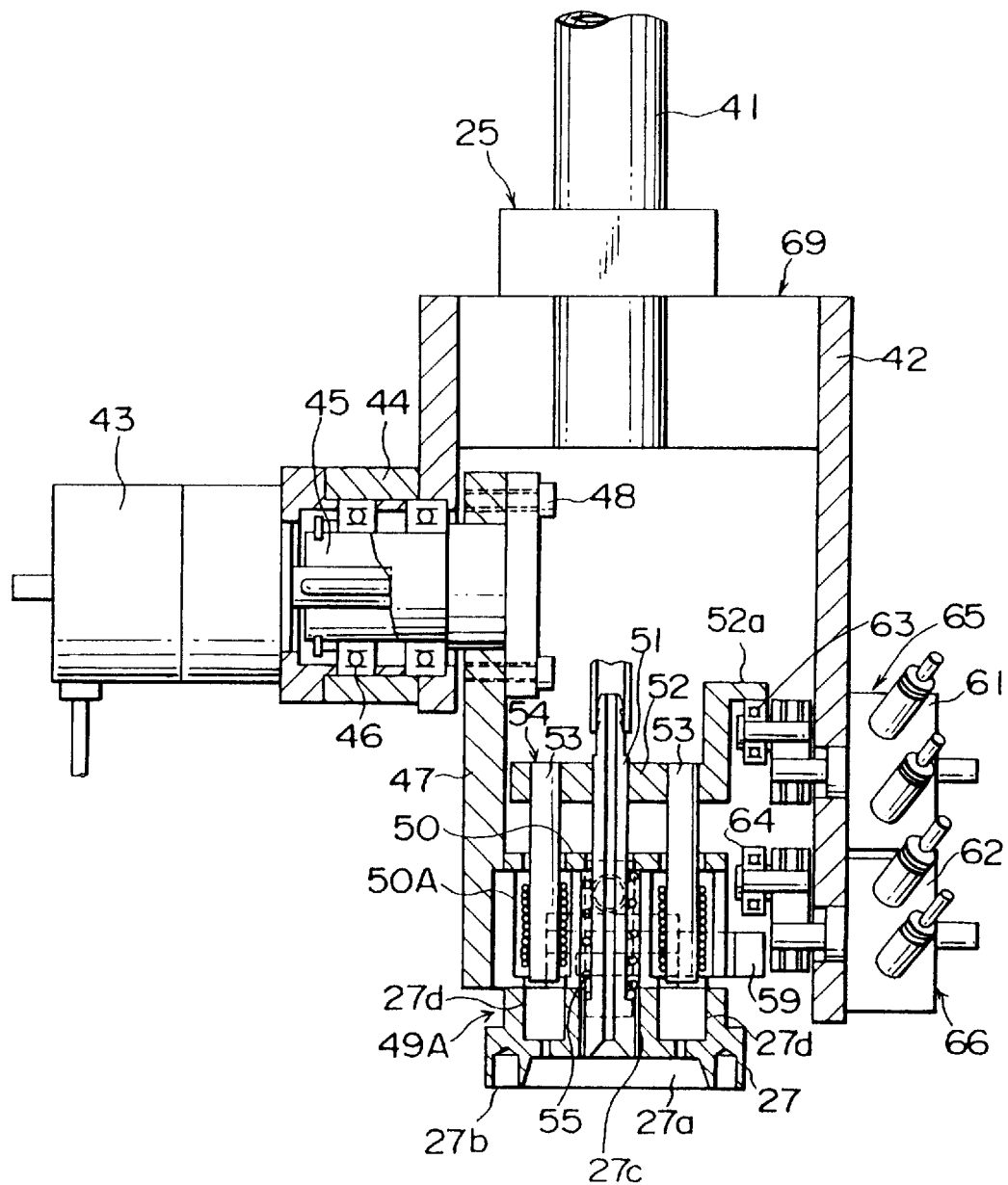
FIG. 9 is a cross-sectional view taken along a line IX—IX of FIG. 8.

Still further, description will be made hereinbelow of a construction of the mounting/demounting head 25. FIG. 8 is a front elevational view showing the mounting/demounting head 25 of FIG. 1, and FIG. 9 is a cross-sectional view taken along line IX—IX of FIG. 8. In the illustrations, a head frame 42 is fixedly secured to a lower end portion of a head shaft 41 supported on the robot body 24 to be movable vertically. A servo motor 43 is attached through a spacer 44 to the head frame 42. A shaft 45 rotated by the servo motor 43 is supported through a ball bearing 46 inside the spacer 44.

An index plate 47 rotatable with the shaft 45 is joined through a bolt 48 to the shaft 45. In the index plate 47, first to third holding sections 49A to 49C for sucking and holding the IC's are disposed radially from the rotating center of the index plate 47.

Each of the holding sections 49A to 49C has a holding section frame 50 fixed to the index plate 47. In addition, a suction assembly 54 allowed to reciprocate vertically in FIG. 9 is provided through an LM bearing (linear motion bearing) 50A on each of the holding sections 49A to 49C. This suction assembly 54 is composed of a suction spindle 51 for sucking up the IC 13, a plate 52 fixed to the suction spindle 51 and having an engagement portion 52a, and two guide bars 53 fixed to the plate 52 to be parallel to the suction spindle 51 and guided by the LM bearing 50A. Further, the suction assembly 54 is biased downwardly in FIG. 9 by a coil spring 55.

Moreover, each of the holding sections 49A to 49C is equipped with a centering tool 27 for centering the IC 13. These centering tools 27 have a centering recess portion 27a for positioning (centering) the IC 13. A side wall of the centering recess portion 27a has a tapered inclination surface with which the external leads 13a of the IC 13 come into contact. Further, the side wall of the centering recess portion 27a is mirror finished to ensure smooth centering. In addition, around the centering recess portion 27a at the lower end portion of the centering tool 27 there is integrally formed a socket pusher 27b which uniformly presses the cover 37 of the IC socket 1A.

Figure 10:
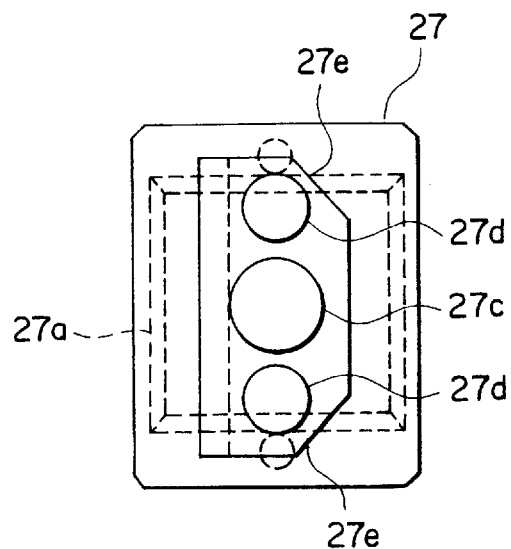
FIG. 10 is a plan view showing a centering tool of FIG. 8.
Figure 11:
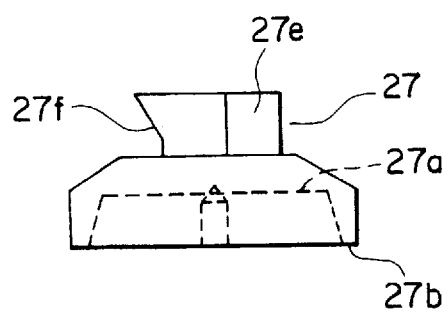
FIG. 11 is a side elevational view showing the centering tool of FIG. 10.

Still further, as shown in FIGS. 10 and 11, each of the centering tools 27 is made up of a spindle hole 27c through which the tip portion of the suction spindle 51 passes, two guide holes 27d into which the guide bars 53 are inserted, a tapered positioning reference surface 27e pressed against the holding section frame 50, and a tapered clamp surface 27f.

Each of the holding section frames 50 is equipped with a holding mechanism 56 for holding the centering tool 27. This holding mechanism 56 is composed of a clamper 58 rotatable about a supporting pin 57, a lever 59 fixed to the clamper 58, and a coil spring 60 for biasing the clamper 58 in a direction to press the clamp surface 27f of the centering tool 27. As mentioned above, each of the holding sections 49A to 49C has the holding frame 50, the suction assembly 54, the coil spring 55, the centering tool 27 and the holding mechanism 56.

First and second rotary actuators (air actuators) 61, 62 are fixed to the head frame 42 in opposed relation to the index plate 47 and in a vertically arranged condition. To these rotary actuators 61, 62 there are respectively connected eccentric rollers 63, 64 which revolve around their shafts to move vertically in FIG. 9. The eccentric roller 63 is engaged with an engagement portion 52a of the plate 52, while the eccentric roller 64 is engaged with the lever 59.

In this example, a head body 69 includes the head shaft 41, the head frame 42, the servo motor 43, the shaft 45, the index plate 47, the first and second rotary actuators 61, 62, and the eccentric rollers 63, 64. Further, a suction section drive means 65 comprises the first rotary actuator 61 and the eccentric roller 63, whereas a tool release means 66 comprises the second rotary actuator 62 and the eccentric roller 64.

Figure 12:
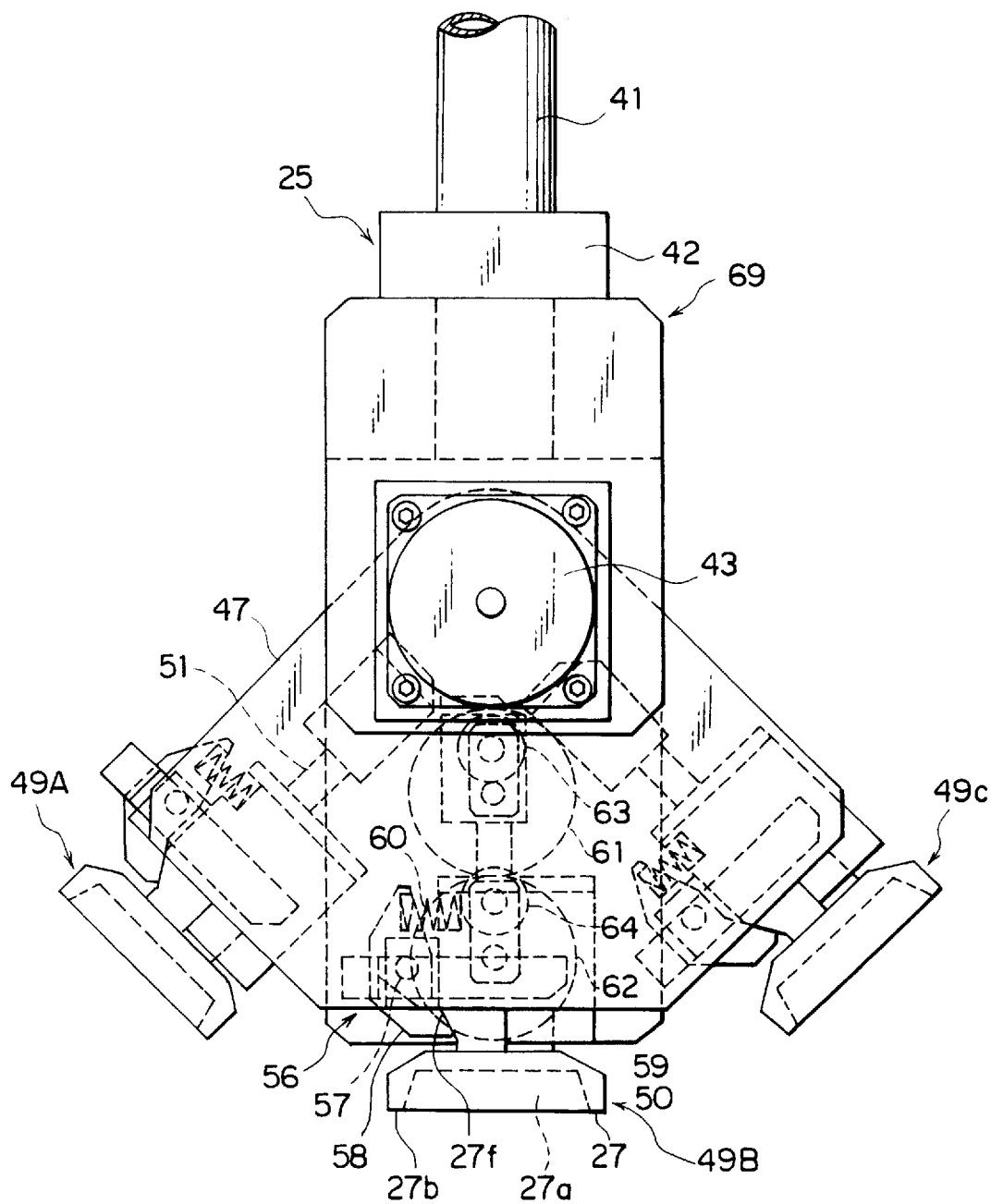
FIG. 12 is a front elevational view showing a rotationally moved state of the holding section of FIG. 8.
Figure 13:
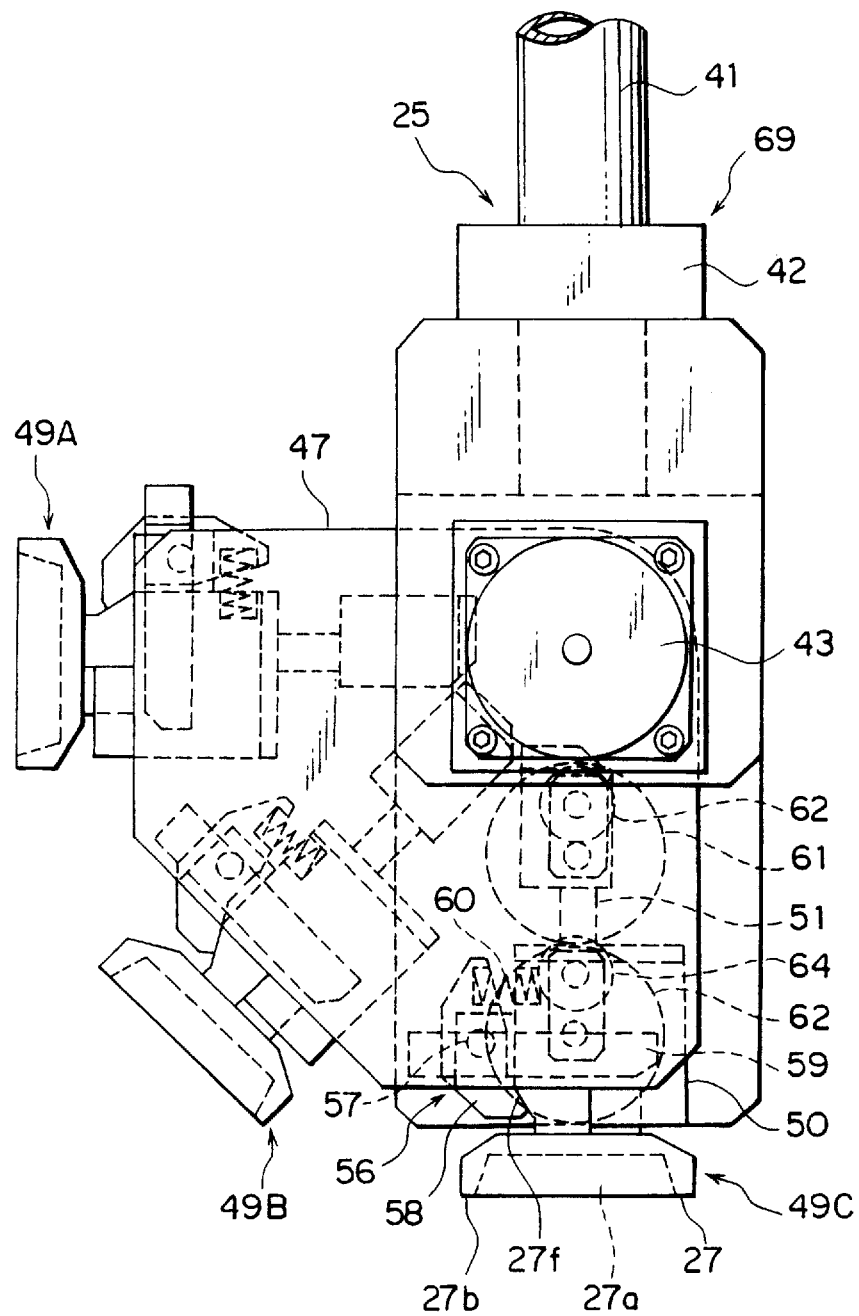
FIG. 13 is a front elevational view showing a rotationally moved state of the holding section of FIG. 12.

In this mounting/demounting head 25, the shaft 45 is rotated by the drive of the servo motor 43 and the index plate 47 is rotated simultaneously. Since the three holding sections 49A to 49C are fixedly secured to the index plate 47, through the control of the servo motor 43, the holding sections 49A to 49C are rotationally shifted from the state of FIG. 8 to the state of FIGS. 12 and 13. Further, the operations are conducted for the holding section 49A in the state of FIG. 8, the holding section 49B in the state of FIG. 12 and the holding section 49C in the state of FIG. 13, that is, the IC 13 mounting and demounting work and the centering tool 27 replacing work are done.

Still further, description will be made hereinbelow of an operation of the mounting/demounting head 25. For example, in cases where the untested IC 13 held by the mounting/demounting head 25 is coupled to a vacant IC socket 1A, as shown in FIG. 14 the mounting/demounting head 25 is first shifted to right above the IC socket 1A. At this time, the suction assembly 54 is pushed upwardly by the eccentric roller 63 against the coil spring 55, and the IC 13 absorbed at the tip portion of the suction spindle 51 is centered and held inside the centering recess portion 27a.

Figure 15:
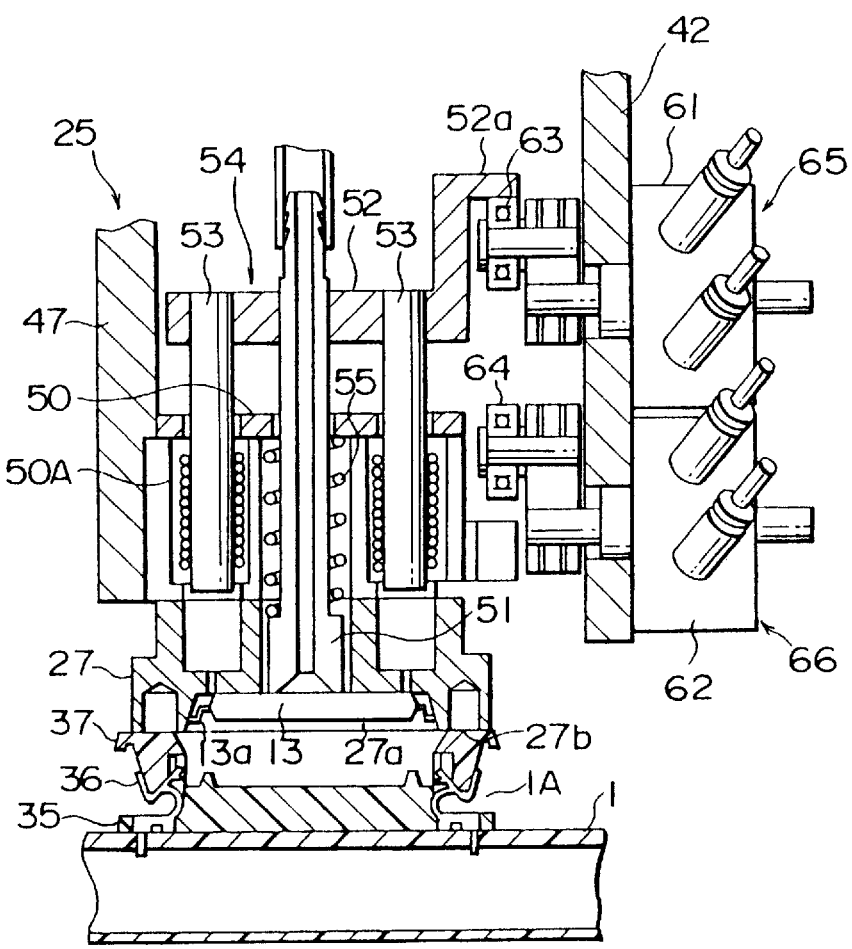
FIG. 15 is a cross-sectional view showing a held-down state of a cover of an IC socket of FIG. 14.
Figure 16:
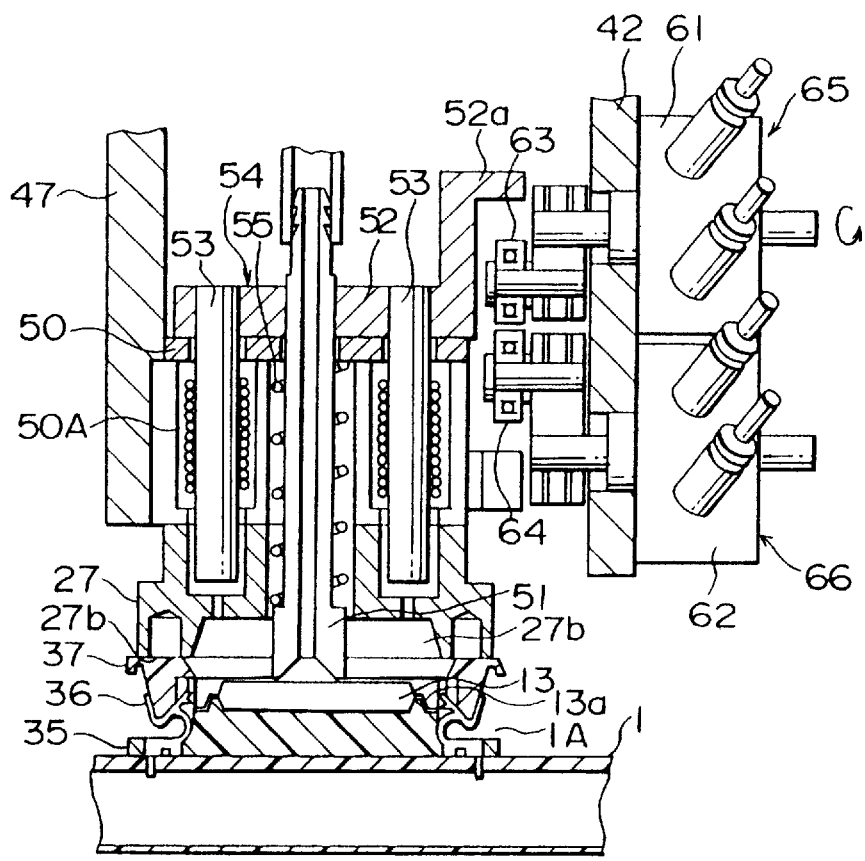
FIG. 16 is a cross-sectional view showing a state where an IC of FIG. 15 is lowered onto an IC socket.

Thereafter, as shown in FIG. 15, the mounting/demounting head 25 is wholly shifted downwardly, and the cover 37 of the IC socket 1A is pushed down by the socket pusher 27b of the centering tool 27, so that the contact pins 36 are elastically deformed. Subsequently, as shown in FIG. 16 the eccentric roller 63 is rotationally moved downwardly in the illustration by means of the first rotary actuator 61 to be released from the engagement with the engagement section 52a. Thus, the suction assembly 54 is guided along the LM bearing 50A owing to the spring force of the coil spring 55 to be moved downwardly, so that the IC 13 is shifted from the centering tool 27 onto the IC socket 1A.

After this, the IC 13 is released from the suction by the suction spindle 51 and the mounting/demounting head 25 is moved upwardly by a given height. Whereupon, the contact pins 36 of the IC socket 1A return to be connected to the external leads 13a of the IC 13, and further the cover 37 goes up to the original position. Then, the servo motor 43 is driven to rotate the index plate 47 by a given angle and to move the mounting/demounting head 25 onto the next IC socket 1A. As in the above description, the IC 13 is coupled to the IC socket 1A.

After all three untested IC's 13 held by the holding sections 49A to 49C are connected to the IC sockets 1A, the tested IC's 13, which are in connection with the IC sockets 1A, are extracted by the mounting/demounting head 25 according to the reverse procedure and conveyed onto the tray 4.

Here, a description will be made of an operation of the IC mounting/demounting system for changing of the kind of IC 13. First of all, the operator inputs an instruction for the type of changing operation to the control panel 30 in FIG. 1 and further inputs the necessary information including the kind of new IC 13, the IC socket to be used etc. This controls, the robot body 24 to bring the mounting/demounting head 25 to the centering tool stocker 28. The memory of the control section 70 is previously stored with the storage positions of the respective centering tools 27 in the centering tool stocker 28, and the mounting/demounting head 25 is correctly shifted to the storage position of the centering tool 27 currently mounted according to that data.

Subsequently, the second rotary actuator 62 is driven so that the eccentric roller 64 is rotationally moved to press the lever 59. Further, the clamper 58 is rotationally moved clockwise in FIG. 8 against the coil spring 60. Whereupon, the clamper 58 is separated from the clamp surface 27f of the centering toll 27. In this state, the mounting/demounting head 25 is moved upwardly, thereby releasing the centering tool 27. After the release of the first centering tool, the index plate 47 is rotated and moved and the mounting/demounting head 25 is shifted, the remaining two centering tools 27 are successively left on the centering tool stocker 28.

Figure 17:
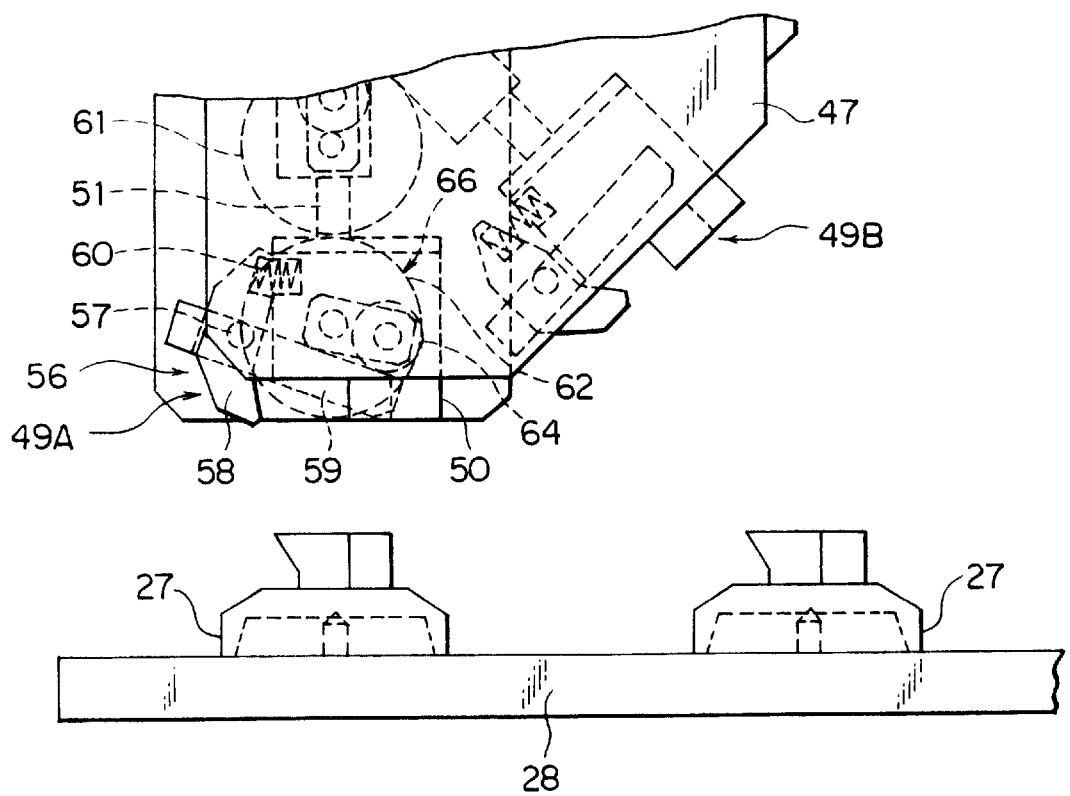
FIG. 17 is a front elevational view showing a centering tool replacement operation by the FIG. 8 mounting/demounting head.
Figure 18:
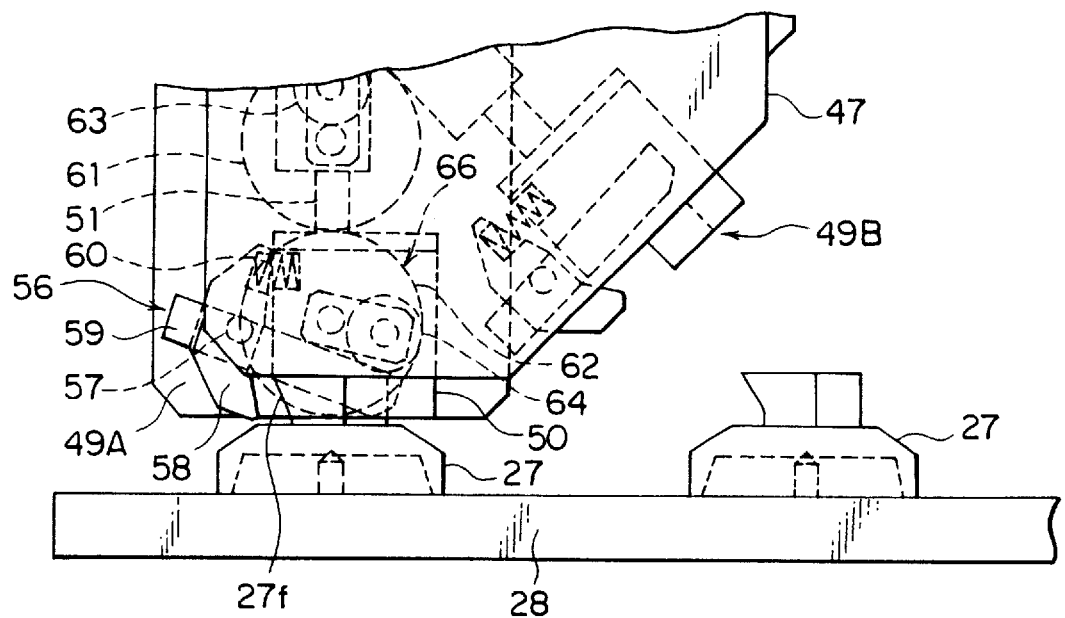
FIG. 18 is a cross-sectional view showing a state where the mounting/demounting head is lowered onto the centering tool of FIG. 17.

After the release of all the centering tools 27, the mounting/demounting head 25 is, as shown in FIG. 17, shifted to above the centering tool 27 to be mounted next. At this time, the clamper 58 of the holding section 49A assumes the open condition. After this, as shown in FIG. 18 the mounting/demounting head 25 is lowered onto the centering tool 27, and the second rotary actuator 62 is driven so that the lever 59 is released from the pressing by the eccentric roller 64. As a result, the clamper 58 is pressed by the coil spring 60 to be pressed against the clamp surface 27f of the centering tool 27. Thus, the centering tool 27 is held in the positioned state at the holding section 49A.

Following this, the mounting/demounting head 25 is lifted as shown in FIG. 19. Further, the index plate 47 is rotated and moved and the mounting/demounting head 25 is shifted to above the next centering tool 27, and in a similar manner centering tools 27 are also successively mounted on the holding sections 49B, 49C, thus completing the replacement of the centering tools 27.

According to the IC mounting/demounting system equipped with such a mounting/demounting head 25, since there is no need to replace the whole mounting/demounting head 25 irrespective of the change in size of IC 13 to be handled, no time is taken for the replacement of the mounting/demounting head 25, thus remarkably enhancing working efficiency. In addition, the previous storage of the information about the IC 13 in the control section 70 allows the automatic replacement of the centering tool 27, with the result that the working efficiency further improves.

Furthermore, because of the simple construction using the servo motor 43 and the index plate 47, the rotational displacement of the positions of the three holding sections 49A to 49C is easily possible. Moreover, since one suction drive means 65 can move the suction spindles 51 of the three holding sections 49A to 49C, whole the structure becomes simple and becomes compact. Besides, since the centering tools 27 can be mounted and demounted to and from the three holding sections 49A to 49C through the use of one tool release means 66, the whole structure becomes ever more simple and compact.

Still further, since the centering tool 27 has the tapered positioning reference surface 27d and the clamp surface 27f, the positioning of the centering tool 27 is practical with just a compact structure and mutual interference between centering tools 27 is avoidable.

Moreover, although the size of the IC socket 1A changes as the size of the IC 13 changes, since the socket pusher 27b having the size corresponding to the size of the IC 13 is formed in the centering tool 27 beforehand, the change in size of the IC socket 1A is simultaneously feasible with only the replacement of the centering tool 27, and hence the structure of the mounting/demounting head 25 becomes simple.

Second Embodiment

Figure 20:
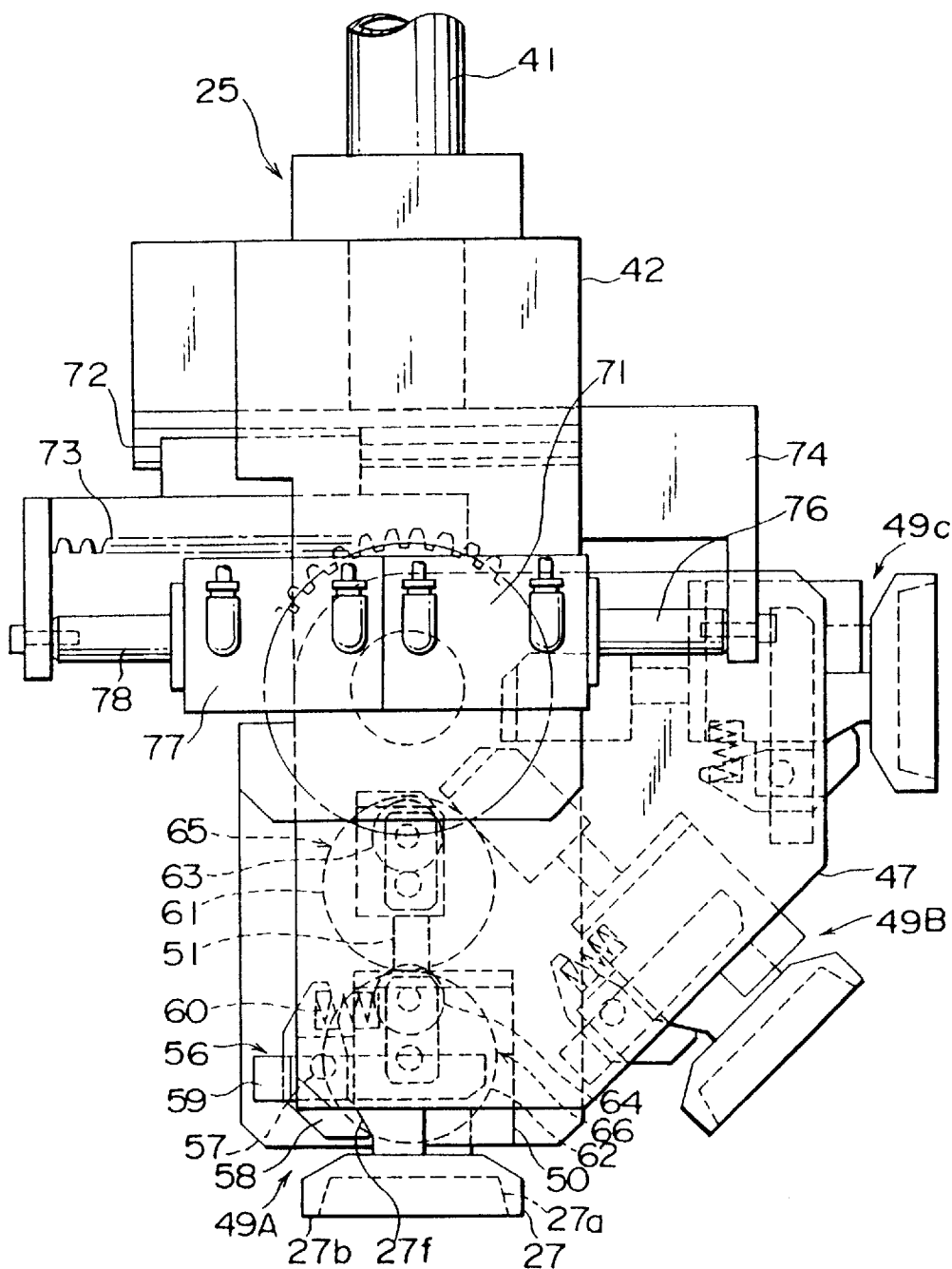
FIG. 20 is a front elevational view showing a mounting/demounting head according to a second embodiment of the present invention.

FIG. 20 is a front elevational view showing a mounting/demounting head according to a second embodiment of the present invention. In the illustration, a pinion 71 fixed to an index plate 47, together with the index plate 47, is rotatable about the rotating center of the index plate 47. A rack guide 72 extending in the right and left directions in the illustration is fixedly secured to a head frame 42. A rack 73 to be geared with the pinion 71 is allowed to reciprocate along the rack guide 72.

A cylinder supporting member 74 is fixedly secured to the head frame 42. Further, to this cylinder supporting member 74 there is fixed the tip portion of a first rod 76 of a first air cylinder 75 which can go in and out (protrude and hide), and to the rear end portion of the first air cylinder there is fixed the rear end portion of a second air cylinder 77. The second air cylinder 77 is equipped with a second rod 78 which can go in and out on the axis of the first rod 76, and the tip portion of the second rod 78 is fixed with respect to the rack 73. The other structures are the same as those in the above-described first embodiment.

Figure 21:
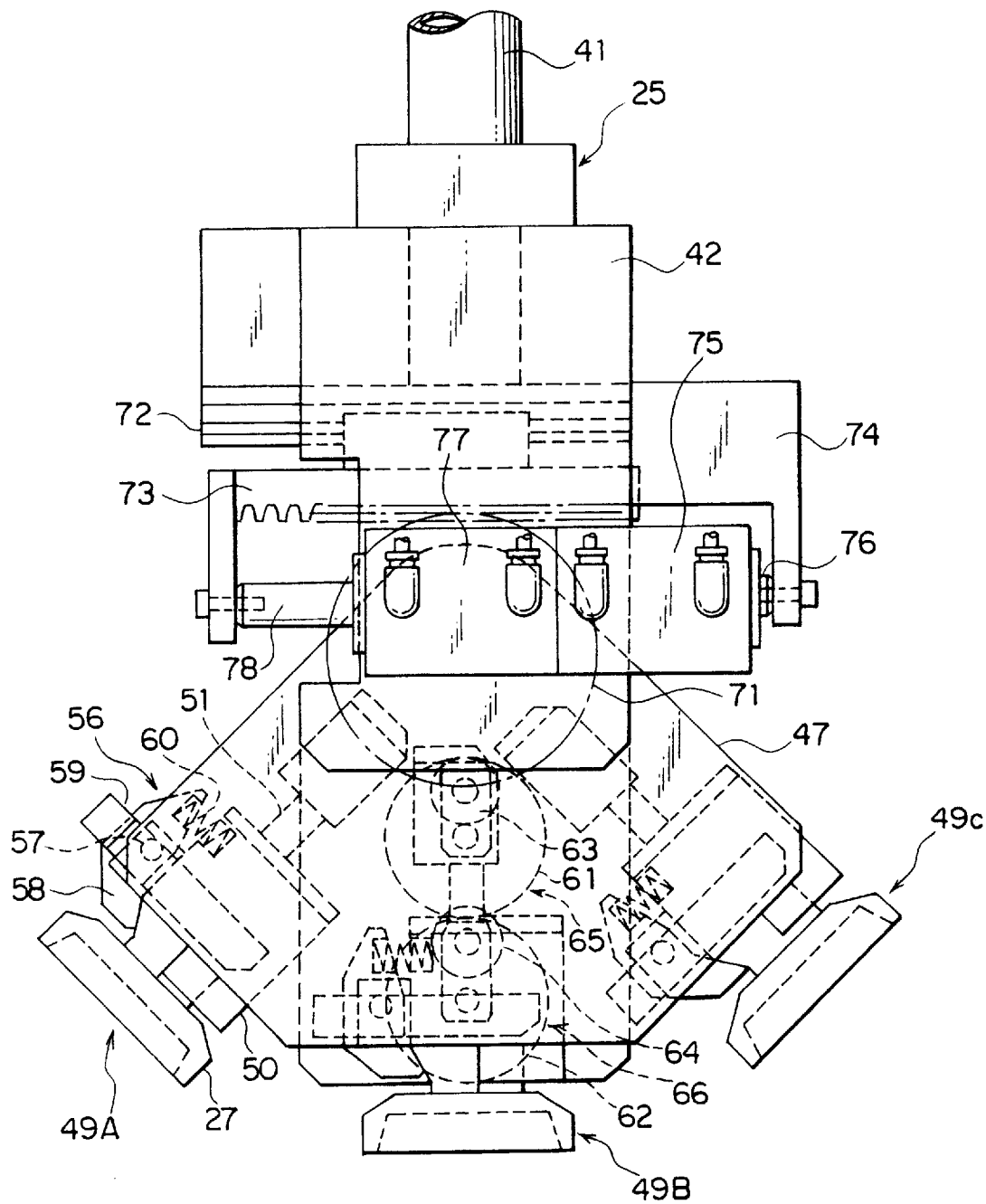
FIG. 21 is a front elevational view showing a rotationally moved condition of a holding section of FIG. 20.

Secondly, in operation, in the state where as shown in FIG. 20 the rods 76, 78 of the two air cylinders 75, 77 assume their protruding conditions, a holding section 49A is at the working position. When the first rod 76 of the first air cylinder 75 retreats from this state, because the tip portion of the first rod 76 is fixed to the cylinder supporting member 74, as shown in FIG. 21 the first air cylinder 75 body is shifted in the right direction in the illustration. The second air cylinder 77 is whereupon, shifted in the right direction in the illustration in a state where the second rod 78 is in the protruding condition, and the rack 73 is also moved in the right direction in the illustration by a distance corresponding to the retreat of the first rod 76.

Figure 22:
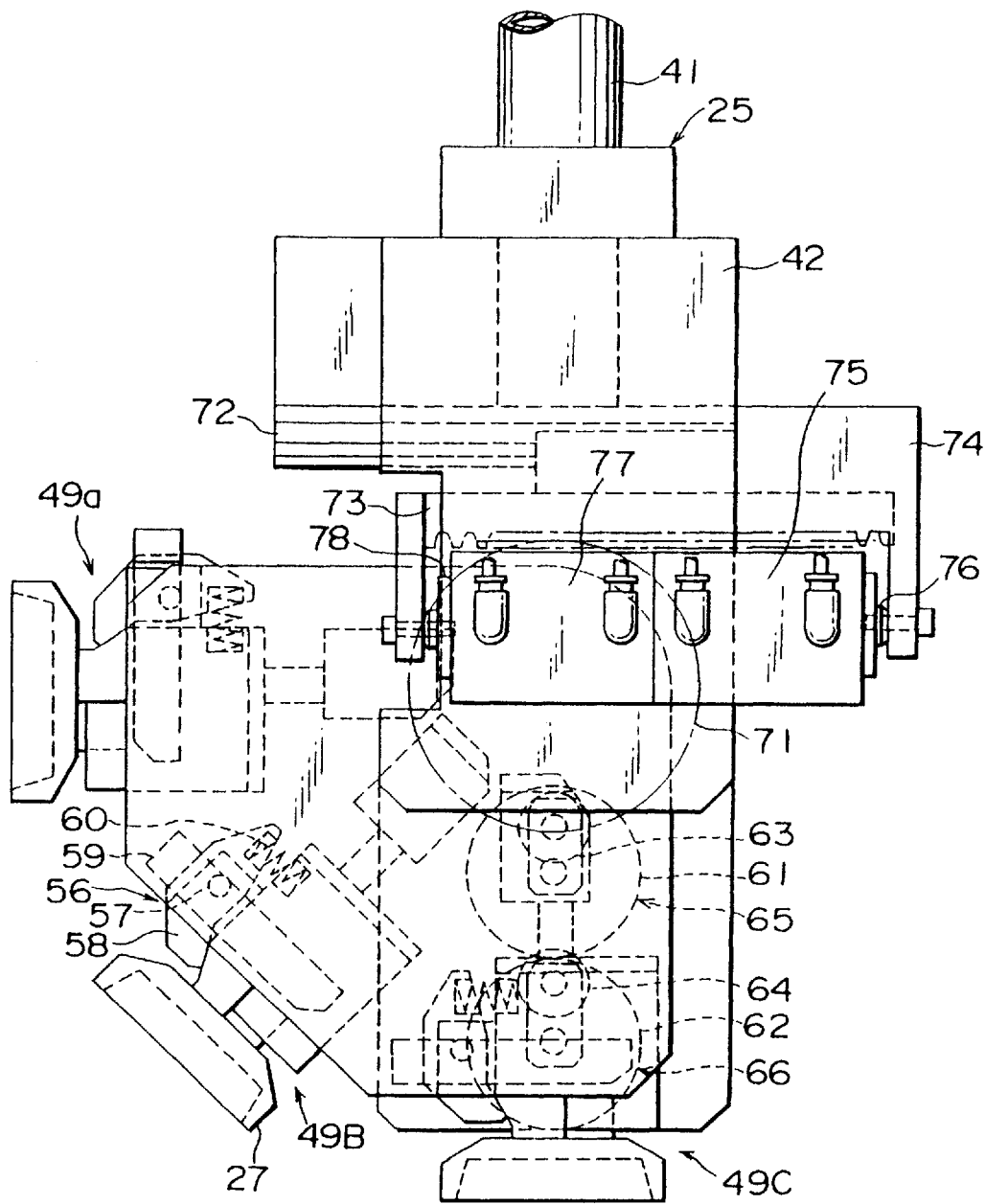
FIG. 22 is a front elevational view showing a rotationally moved condition of a holding section of FIG. 21.

Owing to the movement of the rack 73, the pinion 71, together with the index plate 47, is rotationally moved. Further, as shown in FIG. 21 a holding section 49B comes to the working position. Moreover, when the second rod 78 of the second air cylinder 77 retreats from this state in the right direction in the illustration, as shown in FIG. 22 the rack 73 is shifted in the right direction in the illustration by a distance corresponding to that retreat and the pinion 71 is rotationally moved together with the index plate 47. Further, a holding section 49C is conveyed to the working position. In the case of rotating the holding sections 49A to 49C in the opposite direction, the air cylinders 75, 77 are controlled according to the reverse procedure.

In the case of such a mounting/demounting head 25, through the simple control to advance or retreat the rods 76, 78 of the two air cylinders 75, 77, it is possible to accurately and quickly rotate and move the three holding sections 49A to 49C.

Third Embodiment

Figure 23:
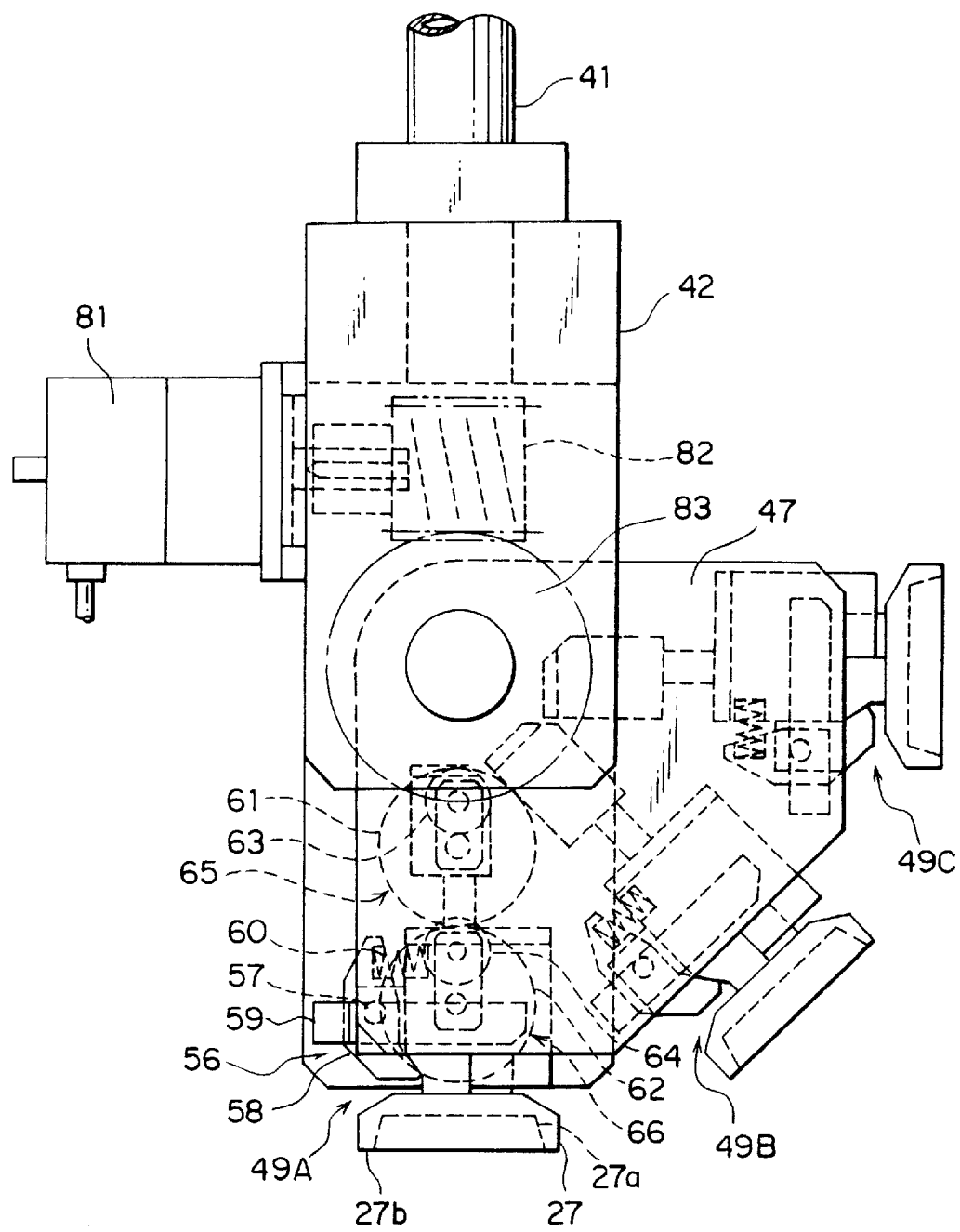
FIG. 23 is a front elevational view showing a mounting/demounting head according to a third embodiment of the present invention.
Figure 24:
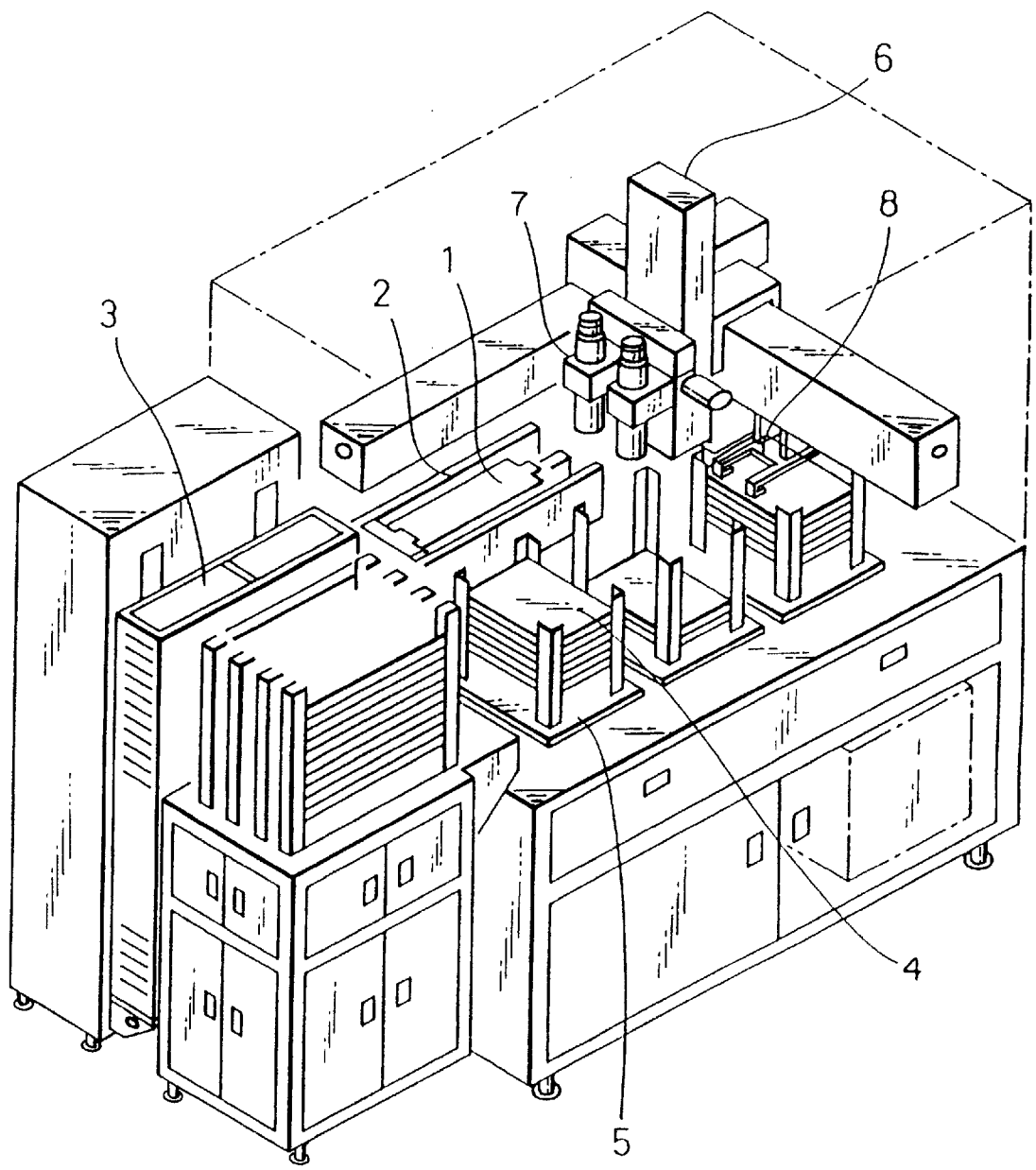
FIG. 24 is a perspective view showing one example of prior IC mounting/demounting systems.

Although in the above-described first embodiment the index plate 47 is directly rotated and moved by the servo motor 43, for example, it is also appropriate that as shown in FIG. 23 a worm gear 82 is fitted over a shaft of a servo motor 81 and a worm wheel 83 engaged with the worm gear 82 is fixedly secured to the index plate 47.

Although in the above example the mounting/demounting head 25 is equipped with the three holding sections 49A to 49C, it any number of holding sections may exist, and the increase in the number of the holding sections allows a further decrease in the number of times the mounting/demounting head 25 moves between the socket board 1 and the tray 4.

Furthermore, although in the above-mentioned example the two kinds of centering tools 27 are made to be interchangeable, if the area of the centering tool stocker 28 is enlarged, it is also possible to keep three or more kinds of tools.

Still further, although in the above example the description is made in terms of the burn-in process, the system according to this invention is also applicable to the electrical operation test before and after the burn-in process if there is a need to mount and demount IC's to and from IC sockets.

What is claimed is:

1. An integrated circuit (IC) mounting/demounting system comprising:

a tray supply section for supplying a tray bearing a plurality of IC's;

a socket board supply section for supplying a socket board having a plurality of IC sockets to and from which said IC's can be mounted and demounted, each of said IC sockets having a movable portion which can be pressed to permit mounting and demounting of one of said IC's;

a robot body for transferring said IC's between said tray supplied to said tray supply section and said socket board supplied to said socket board supply section;

a mounting/demounting head including a plurality of holding sections each capable of sucking and holding one of said IC's and each having a socket pusher for pressing one of said movable portions, said holding sections being rotatable on said mounting/demounting head to move each of said socket pushers into and out of a position opposing one of said movable portions; and a control section for controlling operations of said robot body and said mounting/demounting head.

2. The IC mounting/demounting system as defined in claim 1, further comprising a temporary resting stage provided within an operating range of said robot body and equipped with a plurality of IC supporting sections for receiving said IC's during transfer of said IC's between said tray and said socket board.

3. The IC mounting/demounting system as defined in claim 1, wherein each holding section comprises a detachable centering tool including said socket pusher and having a centering recess portion for centering one of said IC's integral with said socket pusher.

4. The IC mounting/demounting system as defined in claim 3, including a centering tool stocker which allows location of a plurality of sets of centering tools having different sizes and which is placed within an operating range of said robot body.

5. The IC mounting/demounting system as defined in claim 1, wherein each socket pusher is movable by said mounting/demounting head in a prescribed direction to contact said socket pusher against one of said movable portions, and said holding sections are rotatable about an axis transverse to said prescribed direction.

6. The IC mounting/demounting system as defined in claim 5, wherein said axis is perpendicular to said prescribed direction.

7. The IC mounting/demounting system as defined in claim 5, wherein said prescribed direction is vertical and said axis is horizontal.

8. The IC mounting/demounting system as defined in claim 1, wherein said holding sections are rotatable on said mounting/demounting head as a unit.

9. The IC mounting/demounting system as defined in claim 1, wherein each of said holding sections is provided with a suction assembly for sucking one of said IC's, and suction section drive means for moving each of said suction assemblies up and down is provided in said head body.

10. The IC mounting/demounting system as defined in claim 1, wherein said head body is equipped with a rotatable index plate to which said holding sections are fixed.

* * * * *